(12) United States Patent
Ikarashi

(10) Patent No.: US 6,750,708 B2
(45) Date of Patent: Jun. 15, 2004

(54) MINIATURIZED BUFFER AMPLIFIER AND ELECTRONIC CIRCUIT UNIT USING SAME

(75) Inventor: Yasuhiro Ikarashi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/095,888

(22) Filed: Mar. 11, 2002

(65) Prior Publication Data

US 2002/0125946 A1 Sep. 12, 2002

(30) Foreign Application Priority Data

Mar. 12, 2001 (JP) ........................... 2001-068993

(51) Int. Cl.⁷ .................................................. H03F 1/30
(52) U.S. Cl. ........................................ 330/144; 330/137
(58) Field of Search ................................ 330/137, 144, 330/284, 302

(56) References Cited

U.S. PATENT DOCUMENTS 5,726,606 A * 3/1998 Marland ...................... 330/302
5,914,634 A * 6/1999 Oberhammer ................ 327/560
6,218,904 B1 * 4/2001 Panther ........................ 330/302
6,243,566 B1 * 6/2001 Peckham et al. ........... 455/127.4
6,522,195 B2 * 2/2003 Watanabe et al. ............. 330/51

FOREIGN PATENT DOCUMENTS

JP          08-008739           1/1996

* cited by examiner

*Primary Examiner*—Khanh Van Nguyen
(74) *Attorney, Agent, or Firm*—Brinks Hofer Gilson & Lione

(57) ABSTRACT

A buffer amplifier is provided which includes an amplifying transistor, an inductance element for feeding power to the collector of the amplifying transistor from a power supply, a resistance attenuator having an input end, an output end, and a ground end, and an output terminal connected to the resistance attenuator. The input end of the resistance attenuator is directly connected to the collector of the amplifying transistor. The ground end is connected to the power supply. The output end is connected to the output terminal through a coupling capacitor.

37 Claims, 4 Drawing Sheets

MINIATURIZED BUFFER AMPLIFIER AND ELECTRONIC CIRCUIT UNIT USING SAME

BACKGROUND OF THE INVENTION

1. Field of the Invention

The present invention relates to a buffer amplifier that amplifies, and sets the level of, an oscillation signal output from a voltage-controlled oscillator or the like, and also relates to an electronic circuit unit using the buffer amplifier.

2. Description of the Related Art

The circuit configuration of a buffer amplifier of the related art will now be described with reference to FIG. 4. An amplifying transistor 21 is biased so as to operate at a predetermined operating point as an amplifying device with the emitter thereof being grounded. The amplifying transistor 21 has a base connected to an input terminal 22 and has a collector to which power is fed from a power supply B through an inductance element 23. The collector is also connected to a resistance attenuator 25 through a coupling capacitor 24. The inductance element 23 for feeding power and the coupling capacitor 24 are selected so as to match the impedances between the amplifying transistor 21 side and the resistance attenuator 25 side.

The resistance attenuator 25 is formed as an L-shaped asymmetrical attenuator. The resistance attenuator 25 is not necessarily used for impedance transformation or impedance matching, but is intended primarily for level setting of a signal. The resistance attenuator 25 is connected to an output terminal 27 through a DC-blocking capacitor 26.

For example, a buffer amplifier having the above configuration is used for setting the level of an oscillation signal of a voltage-controlled regulator for use in portable telephones. In such a case, a user (the manufacturer of the portable telephones) mounts a buffer amplifier as described above on a printed circuit board (not shown) according to the level characteristic of an off-the-shelf voltage-controlled regulator.

Since the buffer amplifier described above uses two capacitors, i.e., a coupling capacitor and a DC-blocking capacitor, it results in higher cost, and is also difficult to miniaturize.

In addition, the buffer amplifier involves complexity since the user has to match the signal level thereof with that of a voltage-controlled oscillator or the like that serves as an input signal source.

SUMMARY OF THE INVENTION

Accordingly, it is an object of the present invention to provide a buffer amplifier that is reduced in size and in the number of elements.

Another object of the present invention is to provide an electronic circuit unit in which the buffer amplifier is concurrently used with a voltage-controlled oscillator, which serves as a signal source, such that a signal level is set to a predetermined value in advance.

To these ends, according to a first aspect of the present invention, there is provided a buffer amplifier. The buffer amplifier includes an amplifier, an inductance element to feed power to a terminal of the amplifier from a power supply, a resistance attenuator having an input end, an output end, and a ground end; and an output terminal connected to the resistance attenuator. The input end of the resistance attenuator is directly connected to the terminal of the amplifier, the ground end is connected to the power supply, and the output end of the resistance attenuator is connected to the output terminal through a coupling capacitor. This arrangement provides a circuit having a reduced number of elements.

The resistance attenuator may be formed of an L-shaped, a T-shaped, or a π-shaped asymmetrical circuit. This allows setting of a signal level with a minimum number of elements.

The amplifier may be a transistor and the terminal of the amplifier a collector of the transistor.

According to another aspect of the present invention, an electronic circuit unit is provided. The electronic circuit unit includes the buffer amplifier according to the first aspect of the present invention and a voltage-controlled oscillator. The buffer amplifier sets the level of an oscillation signal output from the voltage-controlled oscillator. This arrangement allows elimination of the complexity of the user having to match the signal levels.

In another aspect the buffer amplifier comprises an amplifier having a terminal, an inductance element connected between the terminal of the amplifier and a power supply, and a resistance attenuator connected between the terminal of the amplifier and an output terminal. Only a single capacitor is connected between the terminal of the amplifier and the output terminal.

DESCRIPTION OF THE PREFERRED EMBODIMENTS

Figure 1:
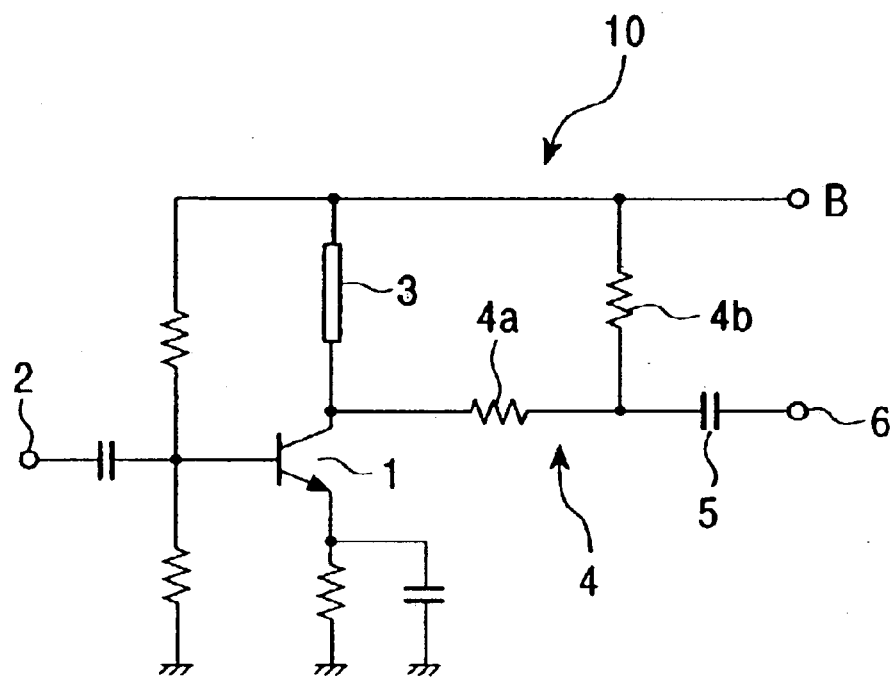
FIG. 1 is a circuit diagram of a buffer amplifier according to an embodiment of the present invention.

A circuit configuration of a buffer amplifier according to an embodiment of the present invention will now be described with reference to FIG. 1. In a buffer amplifier 10, an amplifying transistor 1 is biased so as to operate at a predetermined operating point as an amplifying device with the emitter thereof being grounded. The amplifying transistor 1 has a base connected to an input terminal 2 and has a collector to which power is fed from a power supply B through an inductance element 3. The collector is also connected to a resistance attenuator 4. The amplifier 1 may be either a BJT (bipolar junction transistor) or an FET (field effect transistor).

The resistance attenuator 4 of this embodiment is formed as an asymmetrical attenuator having a pair of resistances 4a and 4b, one end of each being connected so as to form an L-shape. The other end of the resistance 4a serves as an input end, the other end of the resistance 4b is a ground end, and the node is an output end. The input end is directly connected to the collector of the amplifying transistor 1, and the ground end is connected to the power supply B. The output end is connected to an output terminal 6 through a coupling capacitor 5. The resistance attenuator 4 may also be formed of a symmetrical attenuator with a T-shape, a π-shape, or the like.

In the configuration described above, the resistance attenuator 4 sets the DC level of an output signal an may also be used for impedance transformation or impedance matching. The coupling capacitor 5 both matches the output impedance of the transistor 1 with the input impedance of devices connected with the output terminal 6 and also serves a DC-blocking capacitor, along with the inductance element 3.

Figure 2:
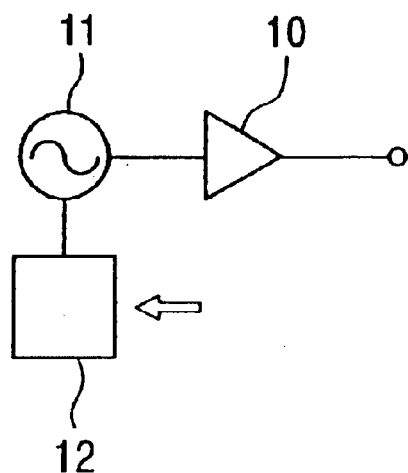
FIG. 2 is a block diagram illustrating an electronic circuit unit according to an embodiment of the present invention.

For example, the buffer amplifier 10 having the configuration described above is configured as an electronic circuit unit in conjunction with a voltage-controlled oscillator and the like for use in a portable telephone. FIG. 2 illustrates the circuit configuration of an electronic circuit unit according to an embodiment of the present invention. This electronic circuit unit is configured as a frequency synthesizer, which includes the buffer amplifier 10, a voltage-controlled oscillator 11 for supplying a signal, and a PLL (phase-locked loop) circuit 12 for controlling the oscillation frequency of the voltage-controlled oscillator 11.

Figure 5:
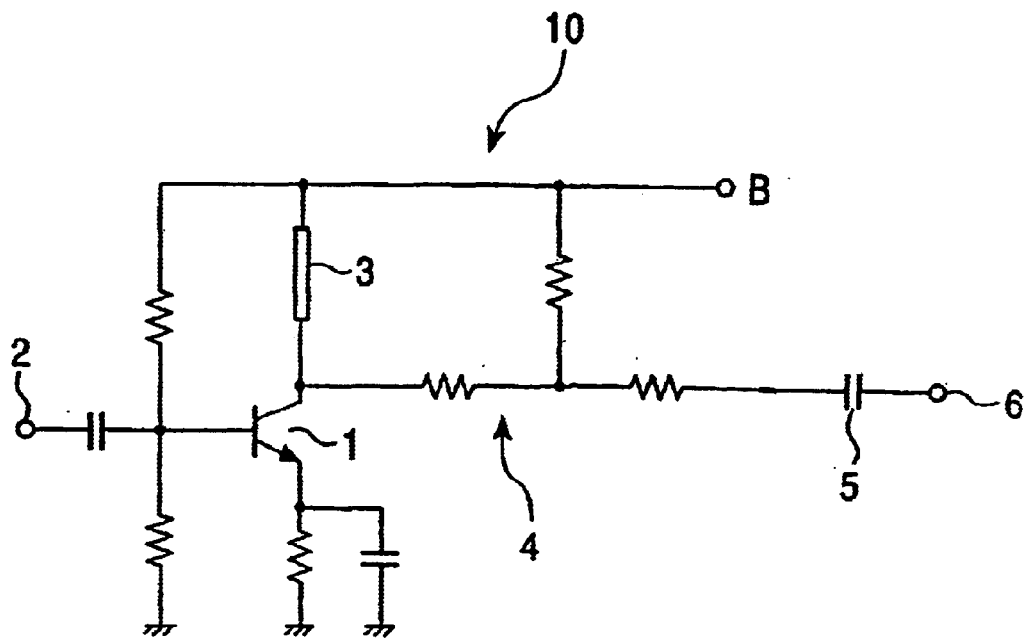
FIG. 5 is a circuit diagram of a buffer amplifier according to a second embodiment of the present invention.
Figure 6:
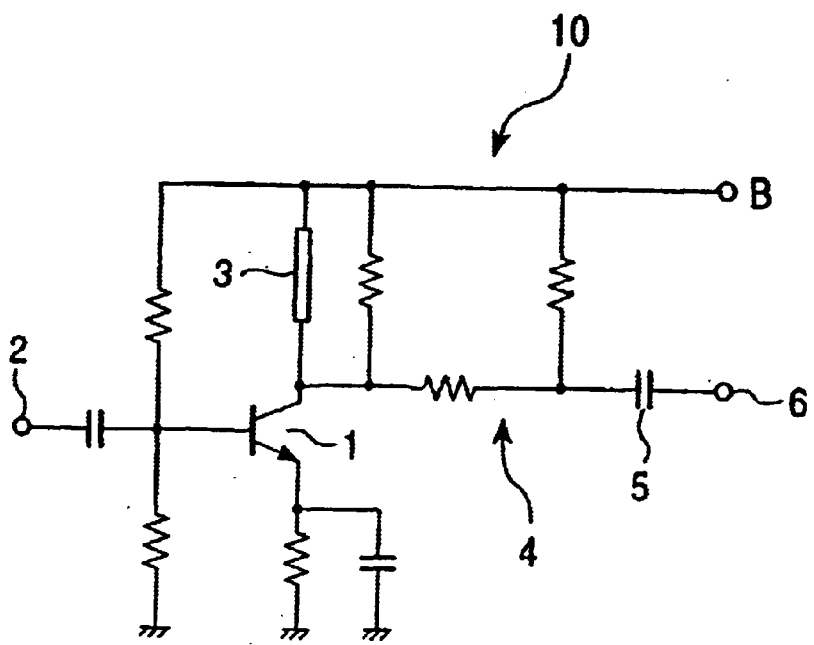
FIG. 6 is a circuit diagram of a buffer amplifier according to a third embodiment of the present invention.

FIG. 5 illustrates an embodiment of present invention where the resistance attenuator 4 is formed in a T-shape. FIG. 6 illustrates an embodiment of the present invention where the resistance attenuator 4 is formed in a π-shape.

An oscillation signal output from the voltage-controlled oscillator 11 is amplified by the amplifying transistor 1 of the buffer amplifier 10, and is further set to a predetermined level by the resistance attenuator 4. This level setting is performed by suitably setting the resistance values of the resistances 4a and 4b.

Figure 3:
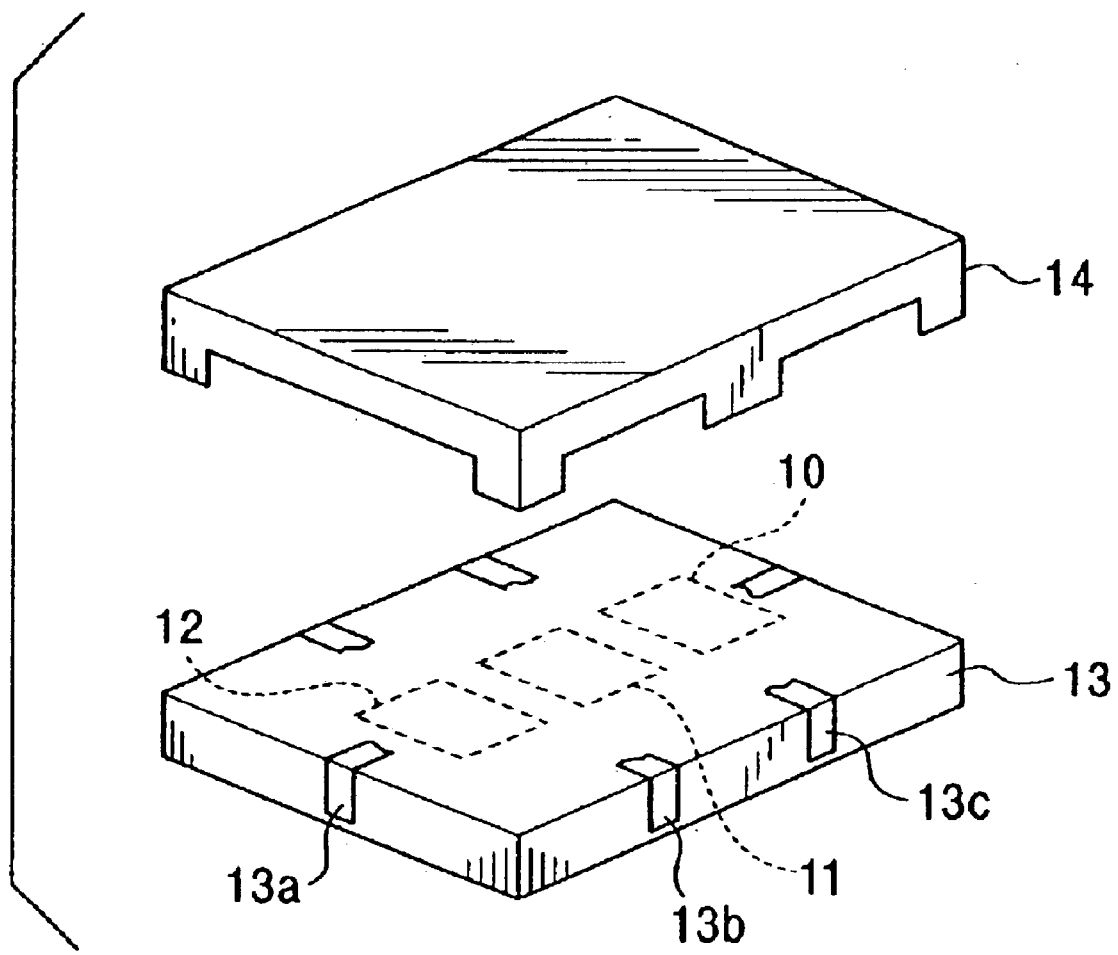
FIG. 3 is an exploded perspective view of the electronic circuit unit of the present invention.
Figure 4:
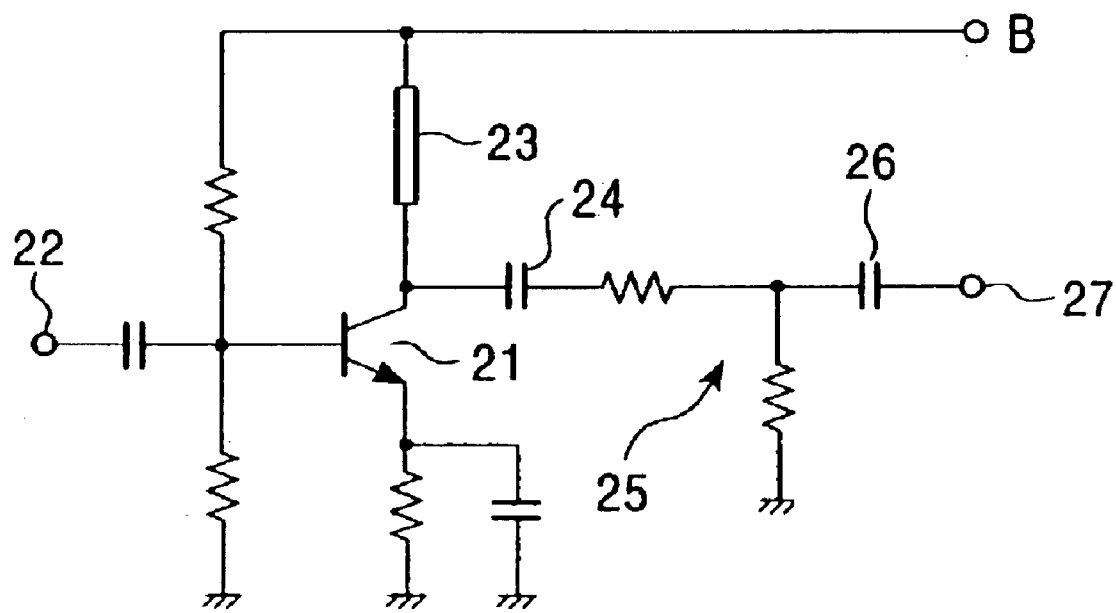
FIG. 4 is a circuit diagram of a buffer amplifier of the related art.

FIG. 3 is an exploded perspective view of the frequency synthesizer. Circuit elements mounted on a printed circuit board 13 constitute the buffer amplifier 10, the voltage-controlled oscillator 11, the PLL circuit 12, and the like. Terminal electrodes 13a, 13b, 13c, . . . , 13n are provided on the side surfaces of the printed circuit board 13 and are connected with the buffer amplifier 10, the voltage-controlled oscillator 11, the PLL circuit 12, and the like. A cover 14 is also installed on the printed circuit board 13 from above. The frequency synthesizer is then mounted on a motherboard (not shown), and the terminal electrodes 13a, 13b, 13c, . . . , 13n are connected with wire conductors on the motherboard. With this configuration, an oscillation signal having a predetermined level is input to the motherboard circuit.

While the invention has been described with reference to specific embodiments, the description is illustrative of the invention and not to be construed as limiting the invention. Various modifications and applications may occur to those skilled in the art without departing from the true spirit and scope of the invention as defined in the appended claims.

What is claimed is:

1. A buffer amplifier comprising:
an amplifier;
an inductance element to feed power to a terminal of said amplifier from a power supply;
a resistance attenuator having an input end, an output end, and a ground end; and
an output terminal connected to said resistance attenuator,
wherein the input end of said resistance attenuator is directly connected to the terminal of said amplifier, the ground end of said resistance attenuator is connected to the power supply, and the output end of said resistance attenuator is connected to said output terminal through a coupling capacitor.

2. A buffer amplifier according to claim 1, wherein the terminal of the amplifier is a collector of a transistor.

3. A buffer amplifier according to claim 1, wherein said resistance attenuator is formed of an L-shaped circuit.

4. A buffer amplifier according to claim 1, wherein said resistance attenuator is formed of a T-shaped circuit.

5. A buffer amplifier according to claim 1, wherein said resistance attenuator is formed of a π-shaped circuit.

6. An electronic circuit unit comprising said buffer amplifier according to claim 1 and a voltage-controlled oscillator, wherein said buffer amplifier sets a level of an oscillation signal output from said voltage-controlled oscillator.

7. An electronic circuit unit comprising a buffer amplifier and a voltage-controlled oscillator, the buffer amplifier comprising:
an amplifier having a terminal;
an inductance element connected between the terminal of the amplifier and a power supply; and
a resistance attenuator connected between the terminal of the amplifier and an output terminal,
wherein only a single capacitor is connected between the terminal of the amplifier and the output terminal and the buffer amplifier sets a level of an oscillation signal output from the voltage-controlled oscillator.

8. A buffer amplifier according to claim 7, wherein the terminal of the amplifier is a collector of a transistor.

9. A buffer amplifier according to claim 7, wherein said resistance attenuator is formed of an L-shaped circuit.

10. A buffer amplifier according to claim 7, wherein said resistance attenuator is formed of a T-shaped circuit.

11. A buffer amplifier according to claim 7, wherein said resistance attenuator is formed of a π-shaped circuit.

12. A method of reducing circuit elements in a buffer amplifier comprising:
providing an inductance element between a terminal of an amplifier and a power supply;
setting a level of a signal output from the amplifier using a resistance attenuator having an input end connected directly to the terminal of the amplifier and an output end connected with an output terminal; and
grounding an end of the resistance attenuator to the power supply.

13. The method of claim 12, further comprising blocking DC signals extracted from the output end of the resistance attenuator from the output terminal.

14. The method of claim 12, further comprising providing exactly one capacitor between the terminal of the amplifier and the output terminal.

15. The method of claim 14, further comprising providing the capacitor between an output terminal of the resistance attenuator and the output terminal.

16. A method of reducing elements in an electronic unit including a buffer amplifier comprising the method of claim 12.

17. A method of reducing elements in a frequency synthesizer including a buffer amplifier, a voltage-controlled oscillator and a phase-locked loop comprising the method of claim 12.

18. A method of reducing elements in a portable telephone including a buffer amplifier comprising the method of claim 12.

19. A method of reducing circuit elements in a buffer amplifier comprising:
providing an inductance element between a terminal of an amplifier and a power supply;
providing exactly one capacitor between the terminal of the amplifier and an output terminal;

setting a level of a signal output from the amplifier using a resistance attenuator having an input end connected to the terminal of the amplifier and an output end connected with the output terminal; and grounding an end of the resistance attenuator to the power supply.

20. The method of claim 19, further comprising blocking DC signals extracted from the output end of the resistance attenuator from the output terminal.

21. The method of claim 19, further comprising providing the capacitor between an output terminal of the resistance attenuator and the output terminal.

22. A method of reducing elements in an electronic unit including a buffer amplifier comprising the method of claim 19.

23. A method of reducing elements in a frequency synthesizer including a buffer amplifier, a voltage-controlled oscillator and a phase-locked loop comprising the method of claim 19.

24. A method of reducing elements in a portable telephone including a buffer amplifier comprising the method of claim 19.

25. A method of reducing circuit elements in a frequency synthesizer including a buffer amplifier, a voltage-controlled oscillator and a phase-locked loop, the method comprising:

providing an inductance element between a terminal of an amplifier and a power supply; and setting a level of a signal output from the amplifier using a resistance attenuator having an input end connected directly to the terminal of the amplifier and an output end connected with an output terminal.

26. The method of claim 25, further comprising grounding an end of the resistance attenuator to the power supply.

27. The method of claim 25, further comprising blocking DC signals extracted from the output end of the resistance attenuator from the output terminal.

28. The method of claim 25, further comprising providing exactly one capacitor between the terminal of the amplifier and the output terminal.

29. The method of claim 28, further comprising providing the capacitor between an output terminal of the resistance attenuator and the output terminal.

30. A method of reducing elements in an electronic unit containing the frequency synthesizer comprising the method of claim 25.

31. A method of reducing elements in a portable telephone containing the frequency synthesizer comprising the method of claim 25.

32. A method of reducing circuit elements in a frequency synthesizer including a buffer amplifier, a voltage-controlled oscillator and a phase-locked loop, the method comprising:

providing an inductance element between a terminal of an amplifier and a power supply;

providing exactly one capacitor between the terminal of the amplifier and an output terminal; and setting a level of a signal output from the amplifier using a resistance attenuator having an input end connected to the terminal of the amplifier and an output end connected with the output terminal.

33. The method of claim 32, further comprising grounding an end of the resistance attenuator to the power supply.

34. The method of claim 32, further comprising blocking DC signals extracted from the output end of the resistance attenuator from the output terminal.

35. The method of claim 32, further comprising providing the capacitor between an output terminal of the resistance attenuator and the output terminal.

36. A method of reducing elements in an electronic unit containing the frequency synthesizer comprising the method of claim 32.

37. A method of reducing elements in a portable telephone containing the frequency synthesizer comprising the method of claim 32.

* * * * *